(12) United States Patent
Hegde

(10) Patent No.: US 9,337,164 B2
(45) Date of Patent: May 10, 2016

(54) COATING LAYER FOR A CONDUCTIVE STRUCTURE

(71) Applicant: Freescale Semiconductor, Inc., Austin, TX (US)

(72) Inventor: Rama I. Hegde, Austin, TX (US)

(73) Assignee: Freescale Semiconductors, Inc., Austin, TX (US)

( * ) Notice: Subject to any disclaimer, the term of this patent is extended or adjusted under 35 U.S.C. 154(b) by 0 days.

(21) Appl. No.: 14/525,855

(22) Filed: Oct. 28, 2014

(65) Prior Publication Data

US 2015/0214177 A1    Jul. 30, 2015

Related U.S. Application Data

(63) Continuation-in-part of application No. 14/168,764, filed on Jan. 30, 2014, now abandoned.

(51) Int. Cl.
*H01L 23/48* (2006.01)
*H01L 23/00* (2006.01)
(Continued)

(52) U.S. Cl.
CPC ............ *H01L 24/45* (2013.01); *H01L 21/4821* (2013.01); *H01L 21/4846* (2013.01); *H01L 23/49548* (2013.01); *H01L 23/49582* (2013.01); *H01L 23/49586* (2013.01); *H01L 24/43* (2013.01); *H01L 2224/43* (2013.01); *H01L 2224/45147* (2013.01); *H01L 2224/45573* (2013.01); *H01L 2224/45647* (2013.01); *H01L 2224/45666* (2013.01); *H01L 2224/45681* (2013.01); *H01L 2224/45687* (2013.01); *H01L 2224/48091* (2013.01); *H01L 2224/48247* (2013.01); *H01L 2224/48257* (2013.01);
(Continued)

(58) Field of Classification Search
CPC ......... H01L 24/48; H01L 24/49; H01L 24/42; H01L 24/43; H01L 23/49582; H01L 21/4846
See application file for complete search history.

(56) References Cited

U.S. PATENT DOCUMENTS

| 3,019,102 | A | | 1/1962 | Saarivirta | |
| 5,176,786 | A | * | 1/1993 | Debe | ...................... C30B 23/02 117/105 |
| 6,136,682 | A | | 10/2000 | Hegde | |

(Continued)

FOREIGN PATENT DOCUMENTS

EP    1798766 A2    6/2007

OTHER PUBLICATIONS

Chen et al., "Formation of Amorphous Cu-Zr Alloy Powder by Mechanical Alloying," Journal of Marine Science and Technology, vol. 1, No. 1, pp. 59-64, 1993.

(Continued)

*Primary Examiner* — Nicholas Tobergte
(74) *Attorney, Agent, or Firm* — Kelly Kordzik; Matheson Keys Daffer & Kordzik PLLC

(57) ABSTRACT

A coating layer for use in copper integrated circuit interconnect and other conductive structures hinders and decreases oxide growth on surfaces of such conductive structures. The coating layer includes an amorphous copper containing layer deposited on a crystalline copper substrate, such as utilized for a lead frame and a bonding wire. Additional amorphous layers may be interposed between the amorphous copper containing layer and the copper substrate, such as an amorphous tantalum nitride layer and an amorphous titanium nitride layer.

28 Claims, 8 Drawing Sheets

(51) Int. Cl.
*H01L 23/495* (2006.01)
*H01L 21/48* (2006.01)

(52) U.S. Cl.
CPC ............... *H01L2224/48465* (2013.01); *H01L 2224/73265* (2013.01); *H01L 2924/12042* (2013.01)

(56) References Cited

U.S. PATENT DOCUMENTS

| | | | | |
|---|---|---|---|---|
| 6,524,950 | B1* | 2/2003 | Lin | H01L 21/76877 257/E21.585 |
| 6,916,696 | B1* | 7/2005 | Buynoski | H01L 45/04 257/E45.002 |
| 7,645,522 | B2 | 1/2010 | Bischoff et al. | |
| 8,004,094 | B2 | 8/2011 | Uno et al. | |
| 8,044,495 | B2* | 10/2011 | Abbott | B23K 26/0078 257/672 |
| 8,158,460 | B2* | 4/2012 | Abbott | B23K 26/0078 257/672 |
| 2005/0136195 | A1* | 6/2005 | Raval | B01D 15/00 428/1.1 |
| 2010/0320579 | A1* | 12/2010 | Abbott | B23K 26/0078 257/676 |
| 2012/0009739 | A1 | 1/2012 | Abbott | |

OTHER PUBLICATIONS

Wikipedia, Amorphous metal, en.wikipedia.org/w/index.php?title=Amorphous_metal&printable=yes, 6 pages; downloaded from Internet on Dec. 11, 2013.

Zhao et al., "An Investigation into Copper Oxidation Behavior," 2010 11$^{th}$ International Conference on Electronic Packaging Technology & High Density Packaging, pp. 319-323.

Zhou et al., "Initial oxidation kinetics of Cu(100), (110), and (111) thin films investigated by in situ ultra-high-vacuum transmission electron microscopy," J. Mater. Res., vol. 20, No. 7, Jul. 2005, pp. 1684-1694.

* cited by examiner

COATING LAYER FOR A CONDUCTIVE STRUCTURE

CROSS REFERENCE TO RELATED APPLICATION

This application is a continuation-in-part of U.S. patent application Ser. No. 14/168,764, which is hereby incorporated by reference herein.

TECHNICAL FIELD

The present disclosure relates in general to manufacturing of electrical circuitry, and in particular to, a structurally modified coating for electrical connections.

BACKGROUND INFORMATION

In the electronics industry, copper is often utilized for metallic interconnects, such as for integrated circuits to provide electrical interconnections (e.g., bonding wires, lead frames) between an IC die and external circuitry. However, copper tends to oxidize readily, which is not desirable during the manufacturing and assembly of electrical circuitry. Such oxide layers result in less effective electrical interconnections, such as between a lead frame and electrical connections, bonding wires, and between the bonding wires and contact pads on an IC die. Moreover, such oxide layers also result in assembly failures due to the effects of delamination, in which there is a separation between the lead frame, the bonding wire, and the electrical connection.

Figure 1:
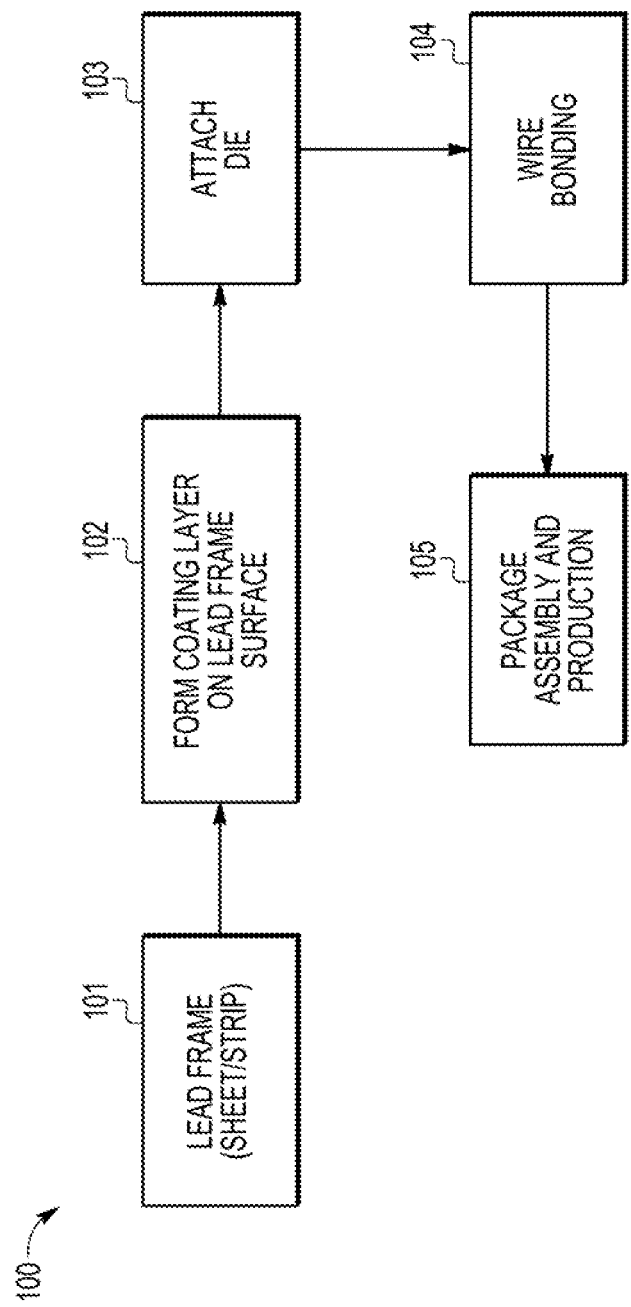
FIG. 1 illustrates a semiconductor manufacturing process configured in accordance with embodiments of the present disclosure.

It will be appreciated that for simplicity and clarity of illustration, elements illustrated in the drawings have not necessarily been drawn to scale. For example, the dimensions of some of the elements (e.g., layer thicknesses) are exaggerated relative to other elements tor clarity.

DETAILED DESCRIPTION

Generally, embodiments of the present disclosure provide a coating layer for use in copper ("Cu") integrated circuit interconnects and other conductive structures, which hinders and decreases oxide growth on surfaces of such conductive structures. Embodiments of the present disclosure are described as utilizing amorphous metals and metal alloys, which are non-crystalline, meaning they have a disordered atomic-scale structure and an absence of grain boundaries. This is distinguished from crystalline metals, which exhibit a highly ordered arrangement of atoms.

FIG. 1 illustrates a process 100 for manufacturing integrated circuit ("IC") packages in accordance with embodiments of the present disclosure. An example of such a finished package is further described hereinafter with respect to FIG. 10. In process block 101, a lead frame is produced (for example, in the form of a sheet or strip) for providing electrical interconnections to an IC die. The lead frame may comprise crystalline copper or at least a crystalline copper surface. Thereafter, in process block 102, a coating layer is formed on the lead frame surface. Various embodiments for forming such a coating layer are described hereinafter with respect to FIGS. 2-9.

Thereafter, in process block 103, an IC die may then be attached to the IC package integrated with the lead frame. Electrical connections from the IC die to various surfaces of the lead frame may then be performed is process block 104, such as with wire bonding. Then, further package assembly and production steps may be performed to complete the IC package in process block 105 (e.g., encapsulating the IC package integrated with the lead frame in a plastic enclosure).

Embodiments of the present disclosure are not limited to implementations with respect to a lead frame, but are applicable to any conductive structure comprising crystalline copper. For example, embodiments are described herein in which the bonding wires utilized in the IC package are manufactured in a similar manner. Hereinafter, in FIGS. 2-7, the substrates 201, 301, 401, 501, 601, and 701 may refer to the crystalline copper surfaces of a lead frame for an IC package, bonding wires, or any other crystalline copper conductive structures, including, but not limited to, conductive lines, traces, and substrates utilized within electronic circuitry. Such crystalline copper structures may include other materials in addition to copper.

In the following descriptions with respect to FIGS. 2-7, various metal, metal alloy, amorphous metal, and amorphous metal alloy films are deposited to form coating layers on a substrate (e.g., a lead frame or a bonding wire). Such layers may be formed using any appropriate process for depositing a metal, metal alloy, amorphous metal, or amorphous metal alloy film (e.g., a physical sputtering process, such as performed with physical vapor deposition (see FIG. 8)). Any other process for depositing an amorphous metal or amorphous metal alloy film may be utilized, including, but not limited to, chemical vapor deposition, extreme rapid cooling, solid state reaction, ion irradiation, (see FIGS. 7 and 9), mechanical alloying, electroplating (e.g., electrode-position and/or electroless deposition), an immersion method, and atomic layer deposition, which are all well-known in the art, and the details for describing how such processes may be utilized to form the various layers in accordance with embodiments of the present disclosure are not necessary for an understanding of such embodiments. Note that the various layers can be deposited in-situ in a multi-chamber film deposition system using any of the foregoing deposition techniques.

Figure 2:
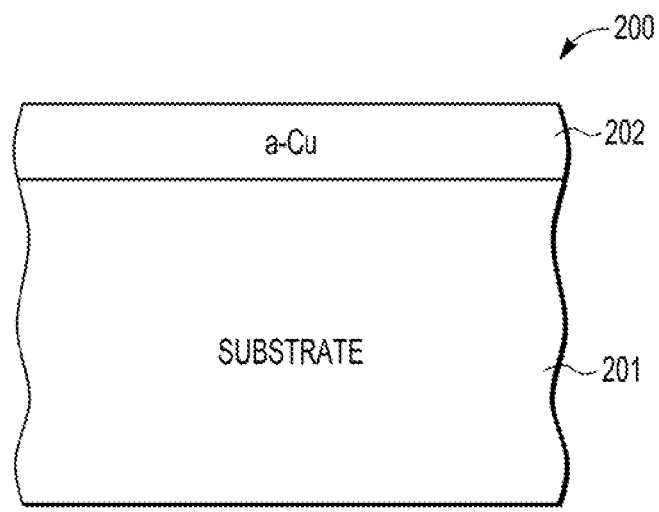
FIGS. 2-7 illustrate various embodiments of the present disclosure.

FIG. 2 illustrates a partial cross-section view of an exemplary structure 200 configured in accordance with embodiments of the present disclosure. On the substrate 201 (e.g., crystalline copper), an amorphous copper ("a-Cu") layer 202 is formed using one of the previously described processes. Amorphous copper layers exhibit a better oxidation resistance properly than crystalline copper, and may be formed as a much thinner layer that is more malleable. The thickness of the formed a-Cu layer 202 may be 25-500 angstroms. Generally, for this embodiment and the other embodiments hereinafter disclosed, a minimum thickness of a particular formed layer is approximately 25 angstroms, since a layer less than this dimension may not be formed as a continuous amorphous film.

Figure 3:
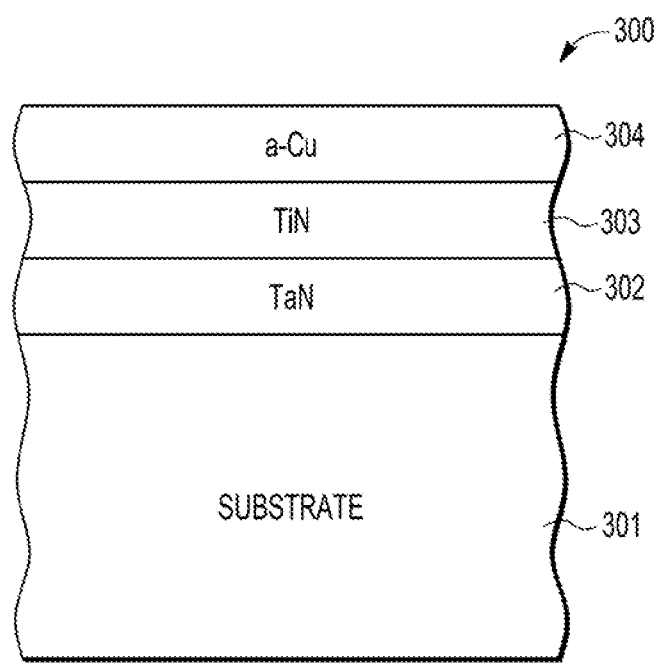

FIG. 3 illustrates a cross-section view of an exemplary structure 300 configured in accordance with embodiments of the present disclosure. A tantalum nitride ("TaN") layer 302 is formed on the substrate 301 (e.g., crystalline copper) using one of the previously described processes. This TaN layer 302 may be formed as an amorphous tantalum nitride layer ("a-TaN"). Then, a titanium nitride ("TiN") layer 303 is formed on the layer 302 using one of the previously described processes. Layer 303 may be formed as an amorphous titanium nitride ("a-TiN") layer. As the TiN layer 303 is deposited on the TaN layer 302, it may mimic the amorphous TaN structure and thus be deposited in an amorphous state. Thereafter, an amorphous copper layer 304 is then formed on the TiN layer 303 using one of the previously described processes. As the copper layer 304 is deposited on the TiN layer 303, it may mimic the amorphous TiN structure to thus be deposited in an amorphous state. The thickness of each of the formed layers 302-304 may be 25-500 angstroms. It has been determined that the intermediate layers 302-303 act as amorphous layers with an absence of grain boundaries so that the top copper finish remains as an amorphous film. Furthermore, the underlying amorphous layer acts as a good diffusion barrier between top copper finish and the base copper substrate. For example, the amorphous titanium nitride provides a good diffusion barrier since it does not react with the copper in the top layer. Therefore, in some embodiments of the present disclosure, the TaN layer is formed over the substrate since it can be readily deposited as an amorphous film; then, the TiN layer can be formed as an amorphous film since its structure will mimic the amorphous structure of the TaN layer, while also acting as a good diffusion barrier.

Figure 4:
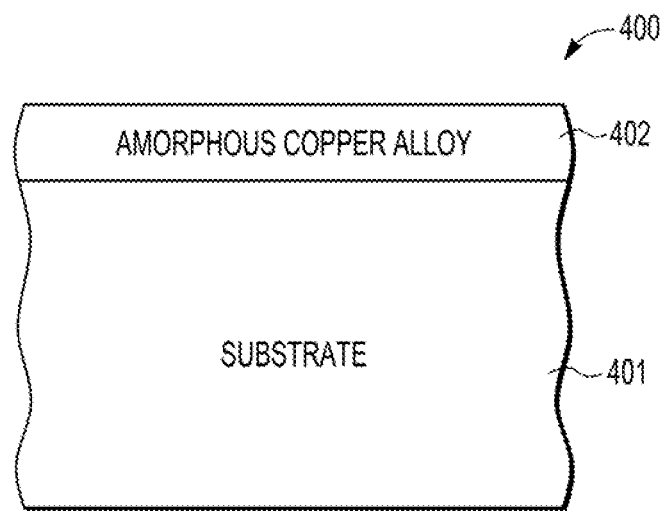

FIG. 4 illustrates a partial cross-section view of an exemplary structure 400 configured in accordance with embodiments of the present disclosure. An amorphous copper alloy layer 402, which may be copper alloyed with zirconium ("Zr") and/or hafnium ("Hf"), is formed on the substrate 401 (e.g., crystalline copper) using one of the previously described processes. The thickness of the formed amorphous copper alloy layer 402 may be 20-500 angstroms. The ratio of copper to Zr or HT in the alloys may be from 0.1 to 0.9. Note that the amorphous copper alloy layer may be comprised of copper alloyed with other suitable materials.

Figure 5:
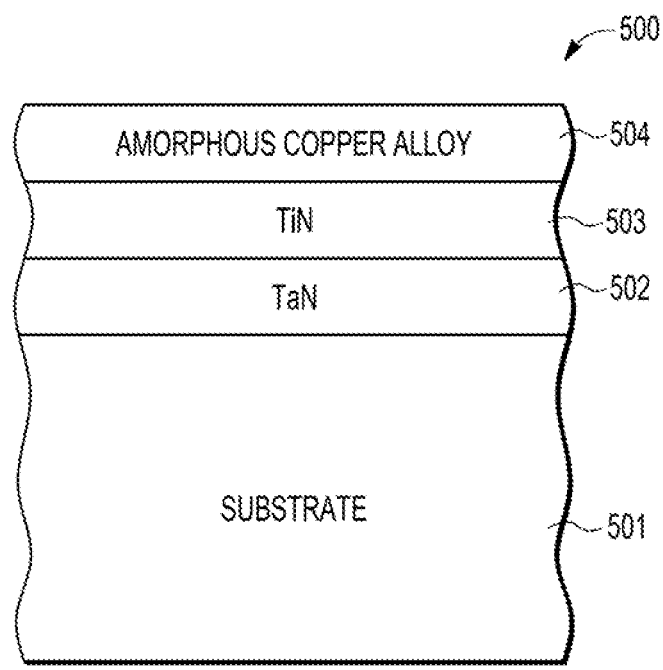

FIG. 5 illustrates a partial cross-section view of an exemplary structure 500 configured in accordance with embodiments of the present disclosure. This method and structure 500 is similar to the method and structure 300 described with respect to FIG. 3, except that an amorphous copper alloy layer 504 is formed on the titanium nitride layer 503, which has been formed on the tantalum nitride layer 502, which has been formed on the substrate 501 (e.g., crystalline copper). Each of these layers may be formed using one of the previously described processes. The amorphous copper alloy may comprise copper alloyed with, zirconium and/or hafnium. The TaN layer 502 and/or TiN layer 503 may be amorphous. The thickness of each of the formed layers 502-504 may be 20-500 angstroms.

Figure 6:
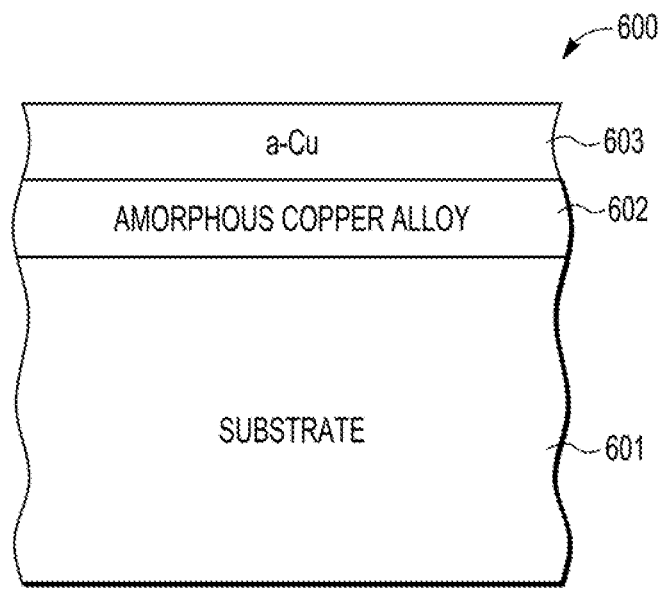

FIG. 6 illustrates a partial cross-section view of an exemplary structure 600 configured in accordance with embodiments of the present disclosure. An amorphous copper alloy layer 602 is formed on the substrate 601 (e.g., crystalline copper) using one of the previously described processes. The amorphous copper alloy may comprise copper alloyed with zirconium and/or hafnium. Then, an amorphous copper layer 603 is formed on the amorphous copper alloy layer 602 using one of the previously described processes. The thickness of each of the formed layers 602-603 may be 20-500 angstroms.

Figure 8:
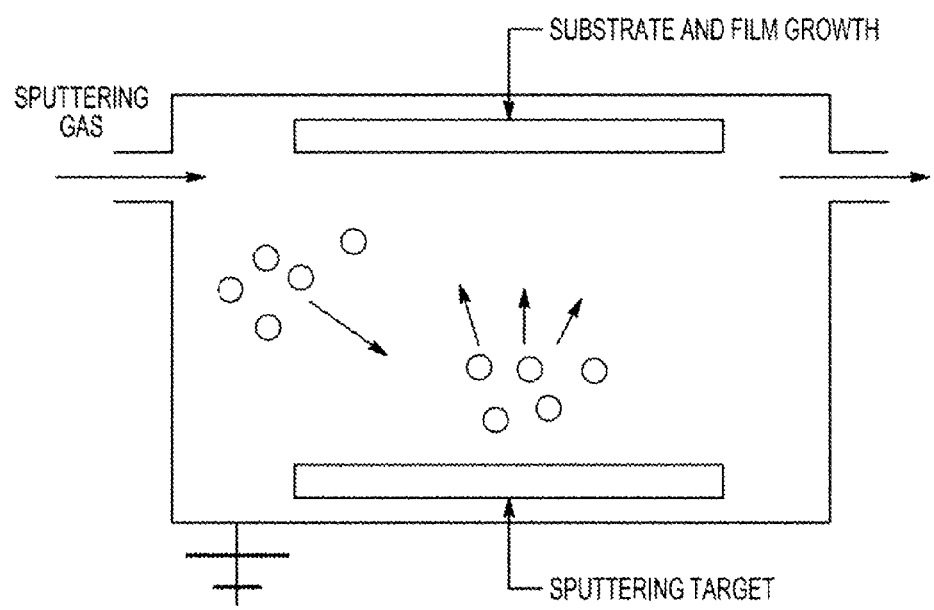
FIG. 8 illustrates an exemplary sputter deposition system for depositing layers in accordance with embodiments of the present disclosure.

FIG. 8 illustrates an exemplary sputter deposition system, which may be utilized for forming the various layers previously described with respect to FIGS. 2-6. Such systems are well-known in the art and commercially available, whereby a sputtering target (e.g., comprised of any of the disclosed metal and/or metal alloys) is bombarded, releasing powders (which may be in the form of atoms and/or molecules) of the target material to be deposited as a film on the substrate.

Figure 7:
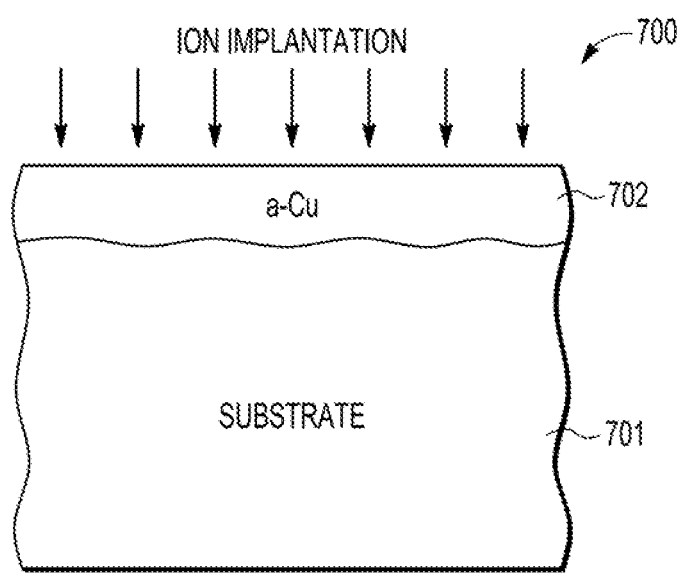

FIG. 7 illustrates a partial cross-section view of an exemplary structure 700 configured in accordance with embodiments of the present disclosure. The surface of the substrate 701 (e.g., crystalline copper) is amorphized by an ion irradiation process to implant ions into the substrate surface and transform the crystalline structure of the substrate to an amorphous one to a desired depth and Rp range depending upon the km irradiation dose, which may be approximately $10^{16}$-$10^{18}$ atoms/cm$^2$. For example, the copper surface of the substrate 701 is amorphized by ion implantation, which results in the amorphous copper layer 702 being formed on the substrate 701. The ions may comprise zirconium, hafnium, nitrogen, phosphorus, arsenic, boron, germanium, carbon, aluminum, silicon, gallium, indium, tin, antimony, bismuth, lead, yttrium, chromium, molybdenum, manganese, tantalum, palladium, platinum, iridium, gold, nickel, etc.

Figure 9:
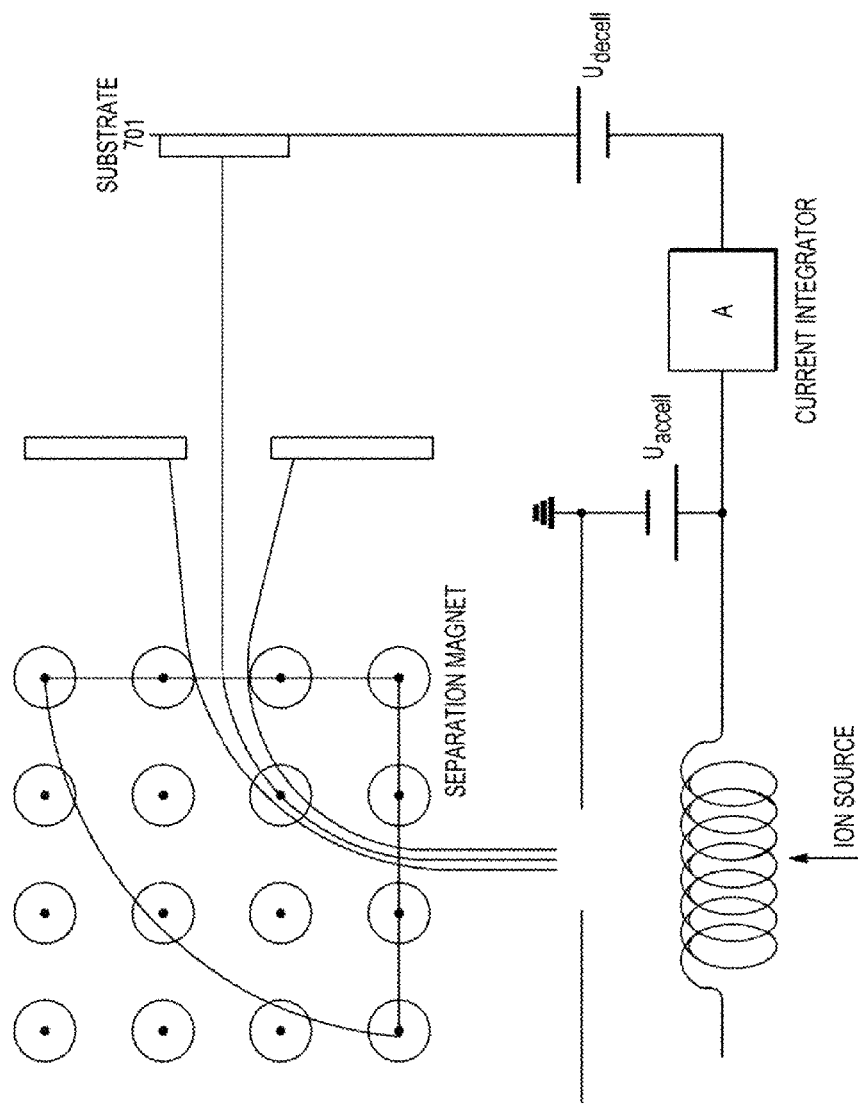
FIG. 9 illustrates an exemplary ion implantation system for forming a coating layer in accordance with embodiments of the present disclosure.

FIG. 9 illustrates an exemplary ion irradiation system, which is well-known in the art. For the sake of simplicity, the system illustrated in FIG. 9 may be utilized to implant ions onto the substrate 701 utilizing an ion source as appropriately selected.

In embodiments of the present disclosure, any one of the layers 202, 304, 402, 504, 602, and 702 is deposited as a continuous film, as distinguished from the intermittent piles of amorphous copper produced by the laser irradiation method disclosed in U.S. published patent application no. 2012/0009739.

Figure 10:
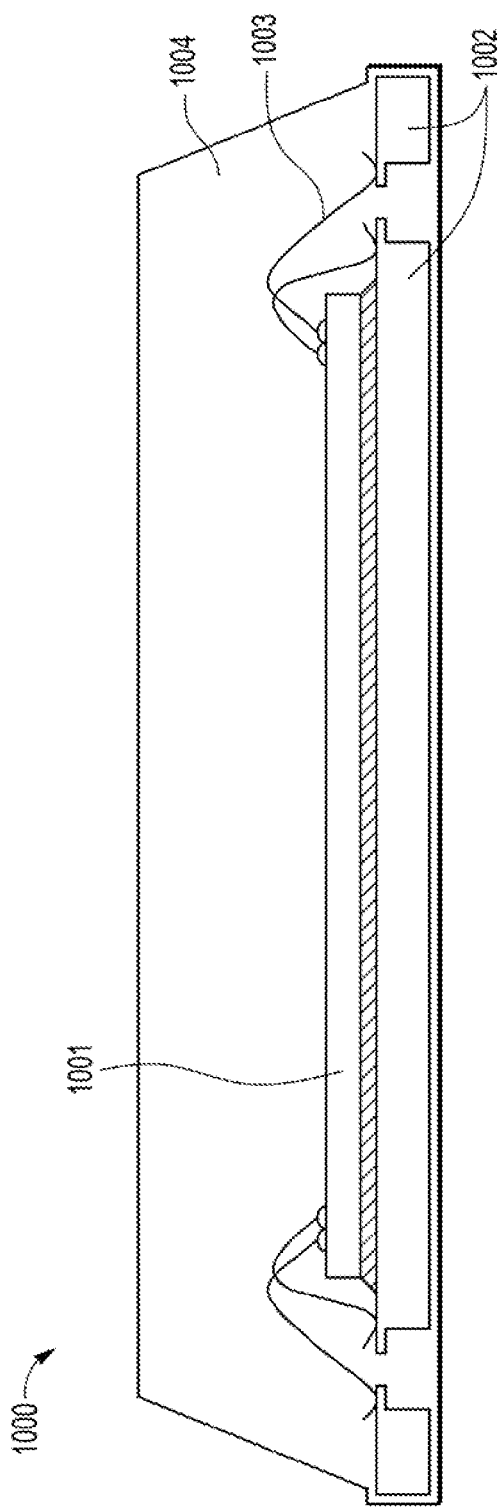
FIG. 10 illustrates exemplary electrical circuitry configured in accordance with embodiments of the present disclosure.

FIG. 10 illustrates a cross-section view of an exemplary IC package 1000 configured in accordance with embodiments of the present disclosure. Note, however, embodiments of the present disclosure are not limited to the specific configuration, shown in FIG. 10. Essentially, any electronic circuitry and/or IC package may be produced having conductive structures (e.g., conductive lines, traces, bonding wires, and/or lead frames) configured in accordance with embodiments described herein (e.g., a flip-chip IC package). A lead frame 1002 configured in accordance with any of the various embodiments previously described is electrically connected to contact pads on an IC die 1001, such as through the use of bonding wires 1003. An encapsulation 1004 may be utilized to then enclose the IC package 1000.

Figure 11:
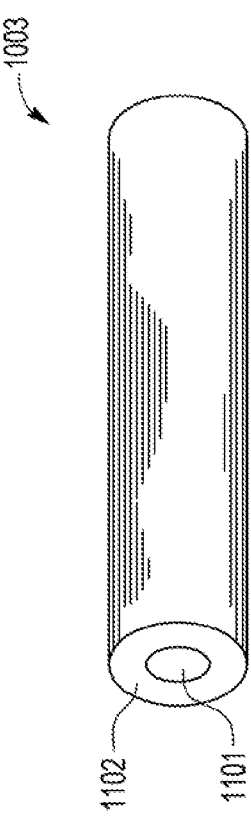
FIG. 11 illustrates a bonding wire configured in accordance with embodiments of the present disclosure.

Referring next to FIG. 11, there is illustrated a section of a bonding wire configured in accordance with the various embodiments disclosed herein. The bonding wire may be utilized for any electrical connection within electrical circuitry, such as in a semiconductor package as exemplary illustrated in FIG. 10. However, embodiments of a bonding wire configured as disclosed herein are not to be limited to utilization in such an IC package configuration.

The bonding wire 1003 is configured with a substrate, or core, 1101 and a layer 1102, which may be any one of the layers 202, 304, 402, 504, 602, and 702 disclosed herein, or any combination of the foregoing.

Figure 12:
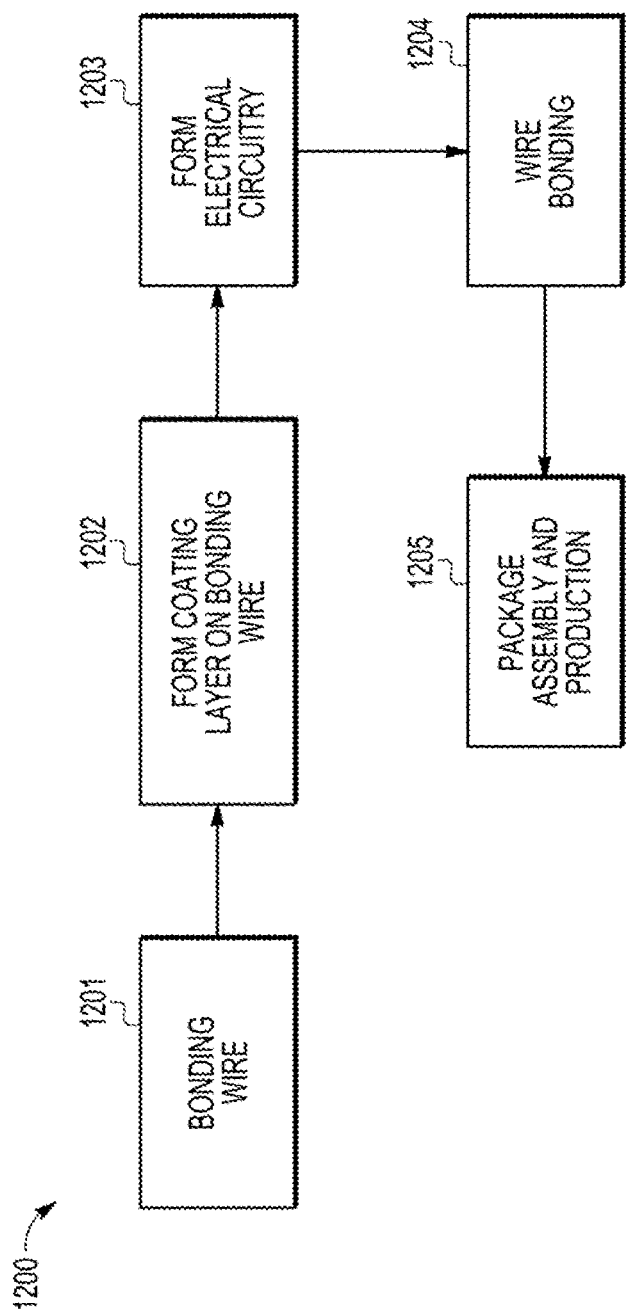
FIG. 12 illustrates a manufacturing process configured in accordance with embodiments of the present disclosure.

FIG. 12 illustrates a process 1200 for manufacturing electrical circuitry (e.g., an integrated circuit ("IC") package such as further described herein with respect to FIG. 10) in accordance with various embodiments of the present disclosure. In process block 1201, one or more bonding wires (e.g., bonding wire 1003) are produced. The bonding wire may comprise crystalline copper, or at least a crystalline copper surface, for its core (e.g., core 1101). Thereafter, in process block 1202, a coating layer (e.g., layer 1102) is formed on a surface of the bonding wire core. Various embodiments for forming such a coating layer have been previously described with respect to FIGS. 2-9.

Thereafter, in process block 1203, the electrical circuitry (e.g., an IC die), which will utilize the one or more bonding wires, may then be formed, or otherwise manufactured (e.g., the IC die attached to an IC package as shown in FIG. 10). The electrical connections within the electrical circuitry utilizing the coated bonding wire (e.g., 1003) may be performed in process block 1204, such as the various wire bonding performed with respect to an IC package. Then, further package assembly and production steps may be performed to complete implementation of the electrical circuitry, such as completing an IC package, in process block 1205.

Note that embodiments of the present disclosure may include an IC package in which both the lead frame and bonding wire(s) incorporate one or more of the various layers disclosed herein.

Embodiments of the present disclosure provide a conductive structure comprising a crystalline copper substrate suitable for an electrically conductive structure, and a coating layer over the crystalline copper substrate, wherein the coating layer comprises a continuous amorphous copper containing film. The coating layer may further comprise an amorphous tantalum nitride layer between the crystalline copper substrate and an amorphous titanium nitride layer, the amorphous titanium nitride layer between the amorphous tantalum nitride layer and the amorphous copper containing film. The amorphous copper containing film may comprise an amorphous copper alloy. In embodiments of the present disclosure, the coating layer may comprise an amorphous copper alloy layer interposed between the amorphous copper containing film and the crystalline copper substrate. In the foregoing embodiments, the amorphous copper alloy may comprise an amorphous copper zirconium alloy or an amorphous copper hafnium alloy. The coating layer may have a thickness in a range of approximately 20-500 angstroms. In the foregoing embodiments, the conductive structure may be a bonding wire. In the foregoing embodiments, the conductive structure may be a lead frame suitable for use in a semiconductor integrated circuit package.

Embodiments of the present disclosure provide a method for forming a conductive structure, the method comprising forming a coating layer on a crystalline copper substrate, wherein the coating layer comprises an amorphous copper containing layer. Forming of the coating layer may further comprise forming an amorphous tantalum nitride layer over the crystalline copper substrate, forming an amorphous titanium nitride layer over the amorphous tantalum nitride layer, and forming the amorphous copper layer over the amorphous titanium nitride layer. In embodiments, the amorphous copper containing layer may be separated from the crystalline copper substrate by the amorphous tantalum, nitride layer and the amorphous titanium nitride layer. The amorphous copper containing layer may comprise an amorphous copper alloy. In embodiments of the present disclosure, forming the coating layer may comprise forming an amorphous copper alloy layer interposed between the amorphous copper containing layer and the crystalline copper substrate. In the foregoing embodiments, the amorphous copper alloy may comprise an amorphous copper zirconium alloy or an amorphous copper hafnium alloy. In embodiments of the present disclosure, the forming of the coating layer on the crystalline copper substrate further comprises performing an ion implantation of the crystalline copper substrate to form the amorphous copper containing layer. In the foregoing embodiments, the conductive structure may be a bonding wire. In the foregoing embodiments, the conductive structure may be a lead frame suitable for use in a semiconductor integrated circuit package.

Embodiments of the present disclosure provide electrical circuitry comprising a conductive structure, wherein the conductive structure further comprises a crystalline copper substrate, and a coating layer on the crystalline copper substrate, wherein the coating layer comprises a continuous amorphous copper containing layer. The coating layer further may further comprise an amorphous tantalum, nitride layer between the crystalline copper substrate and an amorphous titanium nitride layer, wherein the amorphous titanium nitride layer is between the amorphous tantalum nitride layer and the amorphous copper containing layer. The amorphous copper containing layer may comprise an amorphous copper alloy. The coating layer may comprise an amorphous copper alloy layer interposed between an amorphous copper containing layer and the crystalline copper substrate. The electrical circuitry may include an integrated circuit die mounted on a lead frame. The lead frame may comprise the conductive structure. The electrical, circuitry may comprise a bonding wire coupled between the integrated circuit die and the lead frame, wherein the bonding wire comprises the conductive structure.

The use of the word "a" or "an" when used in conjunction with the term "comprising" in the claims and/or the specification may mean "one," but it is also consistent, with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the terms "about" or "approximately" are used to indicate that a value includes the inherent variation of error for the device, the method being employed to determine the value, or the variation that exists among the study subjects.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context. For example, with respect to embodiments of the present disclosure, layers are adjacent to each other as a result of a first layer being formed on the second layer.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a defacto equivalent of any other member of the same list solely based on their presentation in a common group without indications to the contrary. Any steps recited in any method or process claims may be executed in any order and are not limited to the order presented in the claims.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

What is claimed is:

1. A conductive structure comprising:
   a crystalline copper substrate suitable for an electrically conductive structure; and
   a coating layer over the crystalline copper substrate, wherein the coating layer comprises a continuous amorphous copper containing film, wherein the coating layer further comprises:
   an amorphous tantalum nitride layer between the crystalline copper substrate and an amorphous titanium nitride layer; and
   the amorphous titanium nitride layer between the amorphous tantalum nitride layer and the amorphous copper containing film.

2. The conductive structure as recited in claim 1, wherein the amorphous copper containing film comprises an amorphous copper alloy.

3. The conductive structure as recited in claim 2, wherein the amorphous copper alloy is selected from the group consisting of an amorphous copper zirconium alloy and an amorphous copper hafnium alloy.

4. A conductive structure comprising:
   a crystalline copper substrate suitable for an electrically conductive structure; and
   a coating layer over the crystalline copper substrate, wherein the coating layer comprises a continuous amorphous copper containing film, wherein the amorphous copper containing film comprises an amorphous copper alloy.

5. A conductive structure comprising:
   a crystalline copper substrate suitable for an electrically conductive structure; and
   a coating layer over the crystalline copper substrate, wherein the coating layer comprises a continuous amorphous copper containing film, wherein the coating layer comprises an amorphous copper alloy layer interposed between the amorphous copper containing film and the crystalline copper substrate.

6. The conductive structure as recited in claim 5, wherein the amorphous copper alloy layer comprises an amorphous copper zirconium alloy.

7. The conductive structure as recited in claim 5, wherein the amorphous copper alloy layer comprises an amorphous copper hafnium alloy.

8. A conductive structure comprising:
   a crystalline copper substrate suitable for an electrically conductive structure; and
   a coating layer over the crystalline copper substrate, wherein the coating layer comprises a continuous amorphous copper containing film, wherein the coating layer has a thickness in a range of approximately 20-500 angstroms.

9. The A conductive structure comprising:
   a crystalline copper substrate suitable for an electrically conductive structure; and
   a coating layer over the crystalline copper substrate, wherein the coating layer comprises a continuous amorphous copper containing film, wherein the conductive structure is a bonding wire.

10. A conductive structure comprising:
    a crystalline copper substrate suitable for an electrically conductive structure; and
    a coating layer over the crystalline copper substrate, wherein the coating layer comprises a continuous amorphous copper containing film, wherein the conductive structure is a lead frame suitable for use in a semiconductor integrated circuit package.

11. A method for forming a conductive structure, the method comprising forming a coating layer on a crystalline copper substrate, wherein the coating layer comprises a continuous amorphous copper containing layer, wherein the forming of the coating layer on the crystalline copper substrate further comprises:
    forming an amorphous tantalum nitride layer over the crystalline copper substrate;
    forming an amorphous titanium nitride layer over the amorphous tantalum nitride layer; and
    forming the amorphous copper containing layer, wherein the amorphous copper containing layer is separated from the crystalline copper substrate by the amorphous tantalum nitride layer and the amorphous titanium nitride layer.

12. The method as recited in claim 11, wherein the amorphous copper containing layer comprises an amorphous copper alloy.

13. The method as recited in claim 12, wherein the amorphous copper alloy is selected from the group consisting of an amorphous copper zirconium alloy and an amorphous copper hafnium alloy.

14. A method for forming a conductive structure, the method comprising forming a coating layer on a crystalline copper substrate, wherein the coating layer comprises a continuous amorphous copper containing layer, wherein the forming of the coating layer on the crystalline copper substrate further comprises performing an ion implantation of the crystalline copper substrate to form the amorphous copper containing layer.

15. A method for forming a conductive structure, the method comprising forming a coating layer on a crystalline copper substrate, wherein the coating layer comprises a continuous amorphous copper containing layer, wherein the amorphous copper containing layer is formed with an amorphous copper alloy.

16. A method for forming a conductive structure, the method comprising forming a coating layer on a crystalline copper substrate, wherein the coating layer comprises a continuous amorphous copper containing layer, wherein the forming of the coating layer on the crystalline copper substrate further comprises:
    forming an amorphous copper alloy layer over the crystalline copper substrate; and
    forming the amorphous copper containing layer, wherein the amorphous copper containing layer is separated from the crystalline copper substrate by the amorphous copper alloy layer.

17. A method for forming a conductive structure, the method comprising forming a coating layer on a crystalline copper substrate, wherein the coating layer comprises a continuous amorphous copper containing layer, wherein the conductive structure is a bonding wire.

18. A method for forming a conductive structure, the method comprising forming a coating layer on a crystalline copper substrate, wherein the coating layer comprises a continuous amorphous copper containing layer, wherein the conductive structure is a lead frame suitable for use in a semiconductor integrated circuit package.

19. Electrical circuitry comprising a conductive structure, wherein the conductive structure further comprises:
   a crystalline copper substrate; and
   a coating layer on the crystalline copper substrate, wherein the coating layer comprises a continuous amorphous copper containing layer, wherein the coating layer further comprises:
   an amorphous tantalum nitride layer between the crystalline copper substrate and an amorphous titanium nitride layer; and
   the amorphous titanium nitride layer between the amorphous tantalum nitride layer and the amorphous copper containing layer.

20. The electrical circuitry as recited in claim 19, wherein the amorphous copper containing layer comprises an amorphous copper alloy.

21. Electrical circuitry comprising a conductive structure, wherein the conductive structure further comprises:
   a crystalline copper substrate; and
   a coating layer on the crystalline copper substrate, wherein the coating layer comprises a continuous amorphous copper containing layer, wherein the coating layer comprises an amorphous copper alloy layer interposed between an amorphous copper containing layer and the crystalline copper substrate.

22. Electrical circuitry comprising a conductive structure, wherein the conductive structure further comprises:
   a crystalline copper substrate; and
   a coating layer on the crystalline copper substrate, wherein the coating layer comprises a continuous amorphous copper containing layer, wherein the electrical circuitry includes an integrated circuit die mounted on a lead frame.

23. The electrical circuitry as recited in claim 22, wherein the lead frame comprises the conductive structure.

24. The electrical circuitry as recited in claim 22, further comprising a bonding wire coupled between the integrated circuit die and the lead frame, wherein the bonding wire comprises the conductive structure.

25. The method as recited in claim 11, wherein the forming of the coating layer on the crystalline copper substrate further comprises performing a sputter deposition of any one or more of the amorphous tantalum nitride layer, the amorphous titanium nitride layer, or the amorphous copper containing layer.

26. The conductive structure as recited in claim 8, wherein the amorphous copper containing film comprises an amorphous copper alloy.

27. The conductive structure as recited in claim 9, wherein the amorphous copper containing film comprises an amorphous copper alloy.

28. The conductive structure as recited in claim 10, wherein the amorphous copper containing film comprises an amorphous copper alloy.

* * * * *